United States Patent
Xu et al.

(10) Patent No.: US 10,171,028 B2
(45) Date of Patent: Jan. 1, 2019

(54) METHOD AND APPARATUS FOR MONITORING PHOTOVOLTAIC MODULE

(71) Applicant: Huawei Technologies Co., Ltd., Shenzhen (CN)

(72) Inventors: Yunyan Xu, Shenzhen (CN); Yongbing Gao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 158 days.

(21) Appl. No.: 15/484,702

(22) Filed: Apr. 11, 2017

(65) Prior Publication Data

US 2017/0222601 A1 Aug. 3, 2017

Related U.S. Application Data

(63) Continuation of application No. PCT/CN2016/084143, filed on May 31, 2016.

(30) Foreign Application Priority Data

Jun. 3, 2015 (CN) .......................... 2015 1 0298854

(51) Int. Cl.
*H02S 50/00* (2014.01)
*H02S 50/10* (2014.01)
*G01R 31/08* (2006.01)

(52) U.S. Cl.
CPC .............. *H02S 50/00* (2013.01); *G01R 31/08* (2013.01); *H02S 50/10* (2014.12)

(58) Field of Classification Search
CPC .......... H02S 50/00; H02S 50/10; G01R 31/08
See application file for complete search history.

(56) References Cited

U.S. PATENT DOCUMENTS

2010/0085670 A1* 4/2010 Palaniswami ............ H02H 7/20
361/42
2010/0287388 A1 11/2010 Suzuki
(Continued)

FOREIGN PATENT DOCUMENTS

CN 103889022 A 6/2014
CN 104038154 A 9/2014
(Continued)

OTHER PUBLICATIONS

Foreign Communication Form a Counterpart Application, European Application No. 16802539.3, Extended European Search Report dated Jul. 13, 2017, 7 pages.
(Continued)

*Primary Examiner* — Daniel Miller
(74) *Attorney, Agent, or Firm* — Conley Rose, P.C.

(57) ABSTRACT

A method and an apparatus for monitoring a photovoltaic module to reduce a commissioning workload and reduce commissioning complexity, the method includes obtaining communication addresses of all module voltage monitoring apparatuses, establishing a connection to a corresponding module voltage monitoring apparatus using the communication address, obtaining a relative voltage of a corresponding module relative to a voltage reference point from the module voltage monitoring apparatus to which the connection is established; obtaining, according to relative voltages obtained from all the module voltage monitoring apparatuses, a physical location that is of a module corresponding to each module voltage monitoring apparatus and that is in the photovoltaic string; establishing an information table according to the communication address of each module voltage monitoring apparatus and the physical location of the module corresponding to each module voltage monitor-
(Continued)

ing apparatus, and performing module abnormality detection according to the information table.

16 Claims, 4 Drawing Sheets

(56) References Cited

U.S. PATENT DOCUMENTS

| | | |
|---|---|---|
| 2011/0025130 A1 | 2/2011 | Hadar et al. |
| 2012/0223734 A1 | 9/2012 | Takada et al. |
| 2012/0256584 A1 | 10/2012 | Crites |
| 2016/0276977 A1 | 9/2016 | Chaintreuil et al. |

FOREIGN PATENT DOCUMENTS

| | | |
|---|---|---|
| CN | 104505939 A | 4/2015 |
| CN | 104579166 A | 4/2015 |
| CN | 104601086 A | 5/2015 |
| CN | 104917460 A | 9/2015 |
| EP | 2500738 A1 | 9/2012 |
| EP | 2515129 A2 | 10/2012 |
| FR | 3010260 A1 | 8/2013 |

OTHER PUBLICATIONS

Machine Translation and Abstract of Chinese Publication No. CN103889022, Jun. 25, 2014, 9 pages.
Machine Translation and Abstract of Chinese Publication No. CN104038154, Sep. 10, 2014, 8 pages.
Machine Translation and Abstract of Chinese Publication No. CN104505939, Apr. 8, 2015, 7 pages.
Machine Translation and Abstract of Chinese Publication No. CN104579166, Apr. 29, 2015, 8 pages.
Machine Translation and Abstract of Chinese Publication No. CN104601086, May 6, 2015, 20 pages.
Machine Translation and Abstract of Chinese Publication No. CN104917460, Sep. 16, 2015, 24 pages.
Foreign Communication From a Counterpart Application, Chinese Application No. 201510298854.7, Chinese Office Action dated Aug. 2, 2016, 6 pages.
Foreign Communication From a Counterpart Application, PCT Application No. PCT/CN2016/084143, English Translation of International Search Report dated Sep. 2, 2016, 2 pages.

\* cited by examiner

METHOD AND APPARATUS FOR MONITORING PHOTOVOLTAIC MODULE

CROSS-REFERENCE TO RELATED APPLICATIONS

This application is a continuation of International Patent Application No. PCT/CN2016/084143, filed on May 31, 2016, which claims priority to Chinese Patent Application No. 201510298854.7, filed on Jun. 3, 2015. The disclosures of the aforementioned applications are hereby incorporated by reference in their entireties.

TECHNICAL FIELD

The present application relates to the field of photovoltaic cell technologies, and in particular, to a method and an apparatus for monitoring a photovoltaic module.

BACKGROUND

A photovoltaic string includes several photovoltaic modules connected in series, and is configured to absorb solar energy and convert the solar energy to electric energy, to become effective input of an inverter. Because the photovoltaic string is installed in an outdoor environment for a long time, and is affected by a high temperature, high humidity, a hot spot, mechanical damage, and the like, and may also be affected by shadow, accumulated dust and snow, and the like. As a result, the modules convert solar energy to electric energy less efficiently, and some modules fail and therefore become abnormal. To ensure normal working of the photovoltaic string, in an actual application, the modules are monitored in real time by a monitoring center. In a monitoring process, data of each module is sampled in real time, the sampled data of the module is obtained in a wireless or wired communication manner for abnormality analysis, and once it is determined that a module is abnormal, the module is located for eliminating abnormality.

To accurately locate an abnormal module, when a photovoltaic power generating system is established and commissioned, each module is equipped with a module voltage monitoring apparatus, and the monitoring center is connected to the module voltage monitoring apparatus in a wireless or wired communications manner, where communication addresses of all module voltage monitoring apparatuses are different. A location of a module is numbered according to a location sequence of the module in the photovoltaic string, a one-to-one correspondence is established between a location number and a communication address used by a module voltage monitoring apparatus corresponding to the module, and the correspondence is recorded into a monitoring device. When it is determined that a module is abnormal, a communication address of a module voltage monitoring apparatus corresponding to the module is first obtained, and a location number of the abnormal module is found according to the correspondence, to determine a location of the abnormal module in the photovoltaic string. It can be seen that, the correspondence between a location number of a module and a communication address is recorded in a manual manner. However, when there is a relatively large total quantity of photovoltaic panels, manual recording may cause a very heavy workload, and increase complexity of installation and commissioning at an early stage. Consequently, it is difficult to implement installation and commissioning.

SUMMARY

Embodiments of the present application provide a method and an apparatus for monitoring a photovoltaic module, to reduce a commissioning workload at an early establishment stage of a photovoltaic power generating system and reduce commissioning complexity.

A first aspect of the present application provides a method for monitoring a photovoltaic module, applied to a module voltage monitoring system, where the module voltage monitoring system includes a primary monitoring apparatus and several module voltage monitoring apparatuses, a communication address is allocated to each module voltage monitoring apparatus, the primary monitoring apparatus establishes a connection to the corresponding module voltage monitoring apparatus using the communication address, each module voltage monitoring apparatus corresponds to a module of a photovoltaic string, the module voltage monitoring apparatus is configured to sample a relative voltage of the corresponding module relative to a voltage reference point, and the method may include obtaining, by the primary monitoring apparatus, communication addresses of all the module voltage monitoring apparatuses, establishing a connection to a corresponding module voltage monitoring apparatus using the communication address, and obtaining a relative voltage of a corresponding module relative to the voltage reference point from the module voltage monitoring apparatus to which the connection is established; obtaining, by the primary monitoring apparatus according to relative voltages obtained from all the module voltage monitoring apparatuses, a physical location that is of a module corresponding to each module voltage monitoring apparatus and that is in the photovoltaic string; and establishing, by the primary monitoring apparatus, an information table according to the communication address of each module voltage monitoring apparatus and the physical location of the module corresponding to each module voltage monitoring apparatus, and performing module abnormality detection according to the information table, where the information table includes at least a correspondence between the communication address of each module voltage monitoring apparatus and the physical location of the module corresponding to each module voltage monitoring apparatus.

With reference to the first aspect, in a first possible implementation manner, the module voltage monitoring apparatus is further configured to sample an output voltage of the corresponding module, and the performing module abnormality detection according to the information table includes establishing, by the primary monitoring apparatus, a connection to a corresponding module voltage monitoring apparatus using each communication address, and obtaining an output voltage of a corresponding module from the module voltage monitoring apparatus to which the connection is established; determining, by the primary monitoring apparatus according to output voltages obtained from all the module voltage monitoring apparatuses, whether the module corresponding to each module voltage monitoring apparatus is abnormal; and when determining that a module corresponding to any one of the module voltage monitoring apparatuses is abnormal, obtaining, by the primary monitoring apparatus according to a communication address of the module voltage monitoring apparatus and the information table, a physical location that is of the module corresponding to the module voltage monitoring apparatus and that is in the photovoltaic string.

With reference to the first aspect or the first possible implementation manner of the first aspect, in a second possible implementation manner, the module voltage monitoring apparatus and the module in the photovoltaic string correspond one-to-one to each other; or when a quantity of modules in the photovoltaic string is an odd number, a module at an odd-number physical locations in the photovoltaic string and the module voltage monitoring apparatus correspond one-to-one to each other; or when a quantity of modules in the photovoltaic string is an even number, the first module of a positive pole of the photovoltaic string and a module at an even-number physical locations correspond one-to-one to the module voltage monitoring apparatuses.

With reference to the second possible implementation manner of the first aspect, in a third possible implementation manner, when the quantity of the modules in the photovoltaic string is the odd number, the module at the odd-number physical location in the photovoltaic string and the module voltage monitoring apparatus correspond one-to-one to each other, and the performing module abnormality detection according to the information table further includes establishing, by the primary monitoring apparatus, a connection to a corresponding module voltage monitoring apparatus using each communication address, and obtaining an output voltage, a positive pole relative voltage, and a negative pole relative voltage of the module at the odd-number physical location in the photovoltaic string from the module voltage monitoring apparatus to which the connection is established, where the positive pole relative voltage is a relative voltage of a positive pole of the module relative to the voltage reference point, and the negative pole relative voltage is a relative voltage of a negative pole of the module relative to the voltage reference point; calculating, by the primary monitoring apparatus, an output voltage of a module at an even-number physical location between modules at two neighboring odd-number physical locations according to positive pole relative voltages and negative pole relative voltages of the modules at the two odd-number physical locations in the information table; determining, by the primary monitoring apparatus according to the output voltage, whether the module at the even-number physical location between the modules at the two odd-number physical locations is abnormal; and when determining that the module at the even-number physical location between the modules at the two odd-number physical locations is abnormal, obtaining, by the primary monitoring apparatus, a physical location of the module at the even-number physical location between the modules at the two odd-number physical locations according to physical locations of the modules at the two odd-number physical locations in the information table.

With reference to the second possible implementation manner of the first aspect, in a fourth possible implementation manner, when the quantity of the modules in the photovoltaic string is the even number, the first module of the positive pole of the photovoltaic string and the module at the even-number physical location correspond one-to-one to the module voltage monitoring apparatuses, and the performing module abnormality detection according to the information table further includes establishing, by the primary monitoring apparatus, a connection to a corresponding module voltage monitoring apparatus using each communication address, and obtaining output voltages, positive pole relative voltages, and negative pole relative voltages of the first module of the positive pole of the photovoltaic string and the module at the even-number physical location from the module voltage monitoring apparatuses to which the connections are established, where the positive pole relative voltage is a relative voltage of a positive pole of the module relative to the voltage reference point, and the negative pole relative voltage is a relative voltage of a negative pole of the module relative to the voltage reference point; calculating, by the primary monitoring apparatus, an output voltage of a module at an odd-number physical location between modules at two neighboring even-number physical locations according to positive pole relative voltages and negative pole relative voltages of the modules at the two even-number physical locations in the information table; determining, by the primary monitoring apparatus according to the output voltage, whether the module at the odd-number physical location between the modules at the two even-number physical locations is abnormal; and when determining that the module at the odd-number physical location between the modules at the two even-number physical locations is abnormal, obtaining, by the primary monitoring apparatus, a physical location of the module at the odd-number physical location between the modules at the two even-number physical locations according to physical locations of the modules at the two even-number physical locations in the information table.

With reference to the first aspect, or the first possible implementation manner of the first aspect, or the second possible implementation manner of the first aspect, or the third possible implementation manner of the first aspect, or the fourth possible implementation manner of the first aspect, in a fifth possible implementation manner, the obtaining, by the primary monitoring apparatus according to relative voltages obtained from all the module voltage monitoring apparatuses, a physical location that is of a module corresponding to each module voltage monitoring apparatus and that is in the photovoltaic string includes obtaining, by the primary monitoring apparatus according to a sequence of values of the relative voltages obtained from all the module voltage monitoring apparatuses, the physical location that is of the module corresponding to each module voltage monitoring apparatus and that is in the photovoltaic string.

With reference to the fifth possible implementation manner of the first aspect, in a sixth possible implementation manner, the voltage reference point is any one of the following: the positive pole of the photovoltaic string, a negative pole of the photovoltaic string, the earth, or a positive pole or a negative pole of any one of modules in the photovoltaic string.

A second aspect of the present application provides an apparatus for monitoring a photovoltaic module, applied to a module voltage monitoring system, where the module voltage monitoring system includes several module voltage monitoring apparatuses and the apparatus for monitoring a photovoltaic module, a communication address is allocated to each module voltage monitoring apparatus, the apparatus for monitoring a photovoltaic module establishes a connection to the corresponding module voltage monitoring apparatus using the communication address, each module voltage monitoring apparatus corresponds to a module of a photovoltaic string, the module voltage monitoring apparatus is configured to sample a relative voltage of the corresponding module relative to a voltage reference point, and the apparatus for monitoring a photovoltaic module includes a communications module configured to obtain communication addresses of all the module voltage monitoring apparatuses, establish communication with a corresponding module voltage monitoring apparatus using the communication address, and obtain a relative voltage of a corresponding module relative to the voltage reference point from the module voltage monitoring apparatus with which communication is established; and a processing module configured to determine, according to relative voltages obtained from all the module voltage monitoring apparatuses, a physical location that is of a module corresponding to each module voltage monitoring apparatus and that is in the photovoltaic string, establish an information table according to a communication address of each module voltage monitoring apparatus and a physical location of a module corresponding to each module voltage monitoring apparatus, and perform module abnormality detection according to the information table, where the information table includes at least a correspondence between the communication address of each module voltage monitoring apparatus and the physical location of the module corresponding to each module voltage monitoring apparatus.

With reference to the second aspect, in a first possible implementation manner, the module voltage monitoring apparatus is further configured to sample an output voltage of the corresponding module; the communications module is further configured to establish a connection to a corresponding module voltage monitoring apparatus using each communication address, and obtain an output voltage of a corresponding module from the module voltage monitoring apparatus to which the connection is established; and the processing module is further configured to determine, according to output voltages obtained from all the module voltage monitoring apparatuses, whether the module corresponding to each module voltage monitoring apparatus is abnormal, and when determining that a module corresponding to any one of the module voltage monitoring apparatuses is abnormal, determine, according to a communication address of the module voltage monitoring apparatus and the information table, a physical location that is of the module corresponding to the module voltage monitoring apparatus and that is in the photovoltaic string.

With reference to the second aspect or the first possible implementation manner of the second aspect, in a second possible implementation manner, the module voltage monitoring apparatus and the module in the photovoltaic string correspond one-to-one to each other; or when a quantity of modules in the photovoltaic string is an odd number, a module at an odd-number physical locations in the photovoltaic string and the module voltage monitoring apparatuses correspond one-to-one to each other; or when a quantity of modules in the photovoltaic string is an even number, the first module of a positive pole of the photovoltaic string and a module at an even-number physical location correspond one-to-one to the module voltage monitoring apparatuses.

With reference to the second possible implementation manner of the second aspect, in a third possible implementation manner, when the quantity of the modules in the photovoltaic string is the odd number, the module at the odd-number physical location in the photovoltaic string and the module voltage monitoring apparatus correspond one-to-one to each other; the communications module is configured to establish a connection to a corresponding module voltage monitoring apparatus using each communication address, and obtain an output voltage, a positive pole relative voltage, and a negative pole relative voltage of the module at the odd-number physical location in the photovoltaic string from the module voltage monitoring apparatus to which the connection is established, where the positive pole relative voltage is a relative voltage of a positive pole of the module relative to the voltage reference point, and the negative pole relative voltage is a relative voltage of a negative pole of the module relative to the voltage reference point; and the processing module is configured to calculate an output voltage of a module at an even-number physical location between modules at two neighboring odd-number physical locations according to positive pole relative voltages and negative pole relative voltages of the modules at the two odd-number physical locations in the information table; determine, according to the output voltage, whether the module at the even-number physical location between the modules at the two odd-number physical locations is abnormal; and when determining that the module at the even-number physical location between the modules at the two odd-number physical locations is abnormal, determine a physical location of the module at the even-number physical location between the modules at the two odd-number physical locations according to physical locations of the modules at the two odd-number physical locations in the information table.

With reference to the second possible implementation manner of the second aspect, in a fourth possible implementation manner, when the quantity of the modules in the photovoltaic string is the even number, the first module of the positive pole of the photovoltaic string and the module at the even-number physical location correspond one-to-one to the module voltage monitoring apparatuses; the communications module is configured to establish a connection to a corresponding module voltage monitoring apparatus using each communication address, and obtain output voltages, positive pole relative voltages, and negative pole relative voltages of the first module of the positive pole of the photovoltaic string and the module at the even-number physical location from the module voltage monitoring apparatuses to which the connections are established, where the positive pole relative voltage is a relative voltage of a positive pole of the module relative to the voltage reference point, and the negative pole relative voltage is a relative voltage of a negative pole of the module relative to the voltage reference point; and the processing module is configured to calculate an output voltage of a module at an odd-number physical location between modules at two neighboring even-number physical locations according to positive pole relative voltages and negative pole relative voltages of the modules at the two even-number physical locations in the information table; determine, according to the output voltage, whether the module at the odd-number physical location between the modules at the two even-number physical locations is abnormal; and when determining that the module at the odd-number physical location between the modules at the two even-number physical locations is abnormal, determine a physical location of the module at the odd-number physical location between the modules at the two even-number physical locations according to physical locations of the modules at the two even-number physical locations in the information table.

With reference to the second aspect, or the first possible implementation manner of the second aspect, or the second possible implementation manner of the second aspect, or the third possible implementation manner of the second aspect, or the fourth possible implementation manner of the second aspect, in a fifth possible implementation manner, the processing module is configured to determine, according to a sequence of values of the relative voltages obtained from all the module voltage monitoring apparatuses, a physical location that is of a module corresponding to each module voltage monitoring apparatus and that is in the photovoltaic string.

With reference to the fifth possible implementation manner of the second aspect, in a sixth possible implementation manner, the voltage reference point is any one of the following: the positive pole of the photovoltaic string, a negative pole of the photovoltaic string, the earth, or a positive pole or a negative pole of any one of modules in the photovoltaic string.

It can be seen from the foregoing technical solutions that, a primary monitoring apparatus in the embodiments of the present application first obtains communication addresses of all module voltage monitoring apparatuses, establishes a connection to a corresponding module voltage monitoring apparatus using the communication address, and therefore may obtain a relative voltage of a corresponding module relative to a voltage reference point from the module voltage monitoring apparatus. The primary monitoring apparatus determines, according to the relative voltage obtained from each module voltage monitoring apparatus, a physical location of a module corresponding to the module voltage monitoring apparatus in a photovoltaic string, finally establishes an information table according to the communication address of each module voltage monitoring apparatus and the physical location of the module corresponding to each module voltage monitoring apparatus, and therefore may perform module abnormality detection according to the information table, where the information table stores a correspondence between the communication address of each module voltage monitoring apparatus and the physical location of the module corresponding to each module voltage monitoring apparatus. In the present application, when system commissioning is performed at an early establishment stage of a photovoltaic power generating system, a conventional manner of manually recording information is discarded, and instead, a communication address of a module voltage monitoring apparatus corresponding to a module is automatically obtained, a connection to the module voltage monitoring apparatus is established using the obtained communication address, a relative voltage of the module is automatically collected from the module voltage monitoring apparatus, and according to a variation property of a relative voltage of a module in a photovoltaic string relative to a voltage reference point, a physical location that is of a module corresponding to each module voltage monitoring apparatus and that is in the photovoltaic string is determined using a relative voltage, to reduce a workload at an early commissioning stage and reduce commissioning complexity.

BRIEF DESCRIPTION OF THE DRAWINGS

To describe the technical solutions in the embodiments of the present application more clearly, the following briefly describes the accompanying drawings required for describing the embodiments of the present application. The accompanying drawings in the following description show merely some embodiments of the present application, and a person of ordinary skill in the art may still derive other drawings from these accompanying drawings without creative efforts.

DETAILED DESCRIPTION

Figure 1:
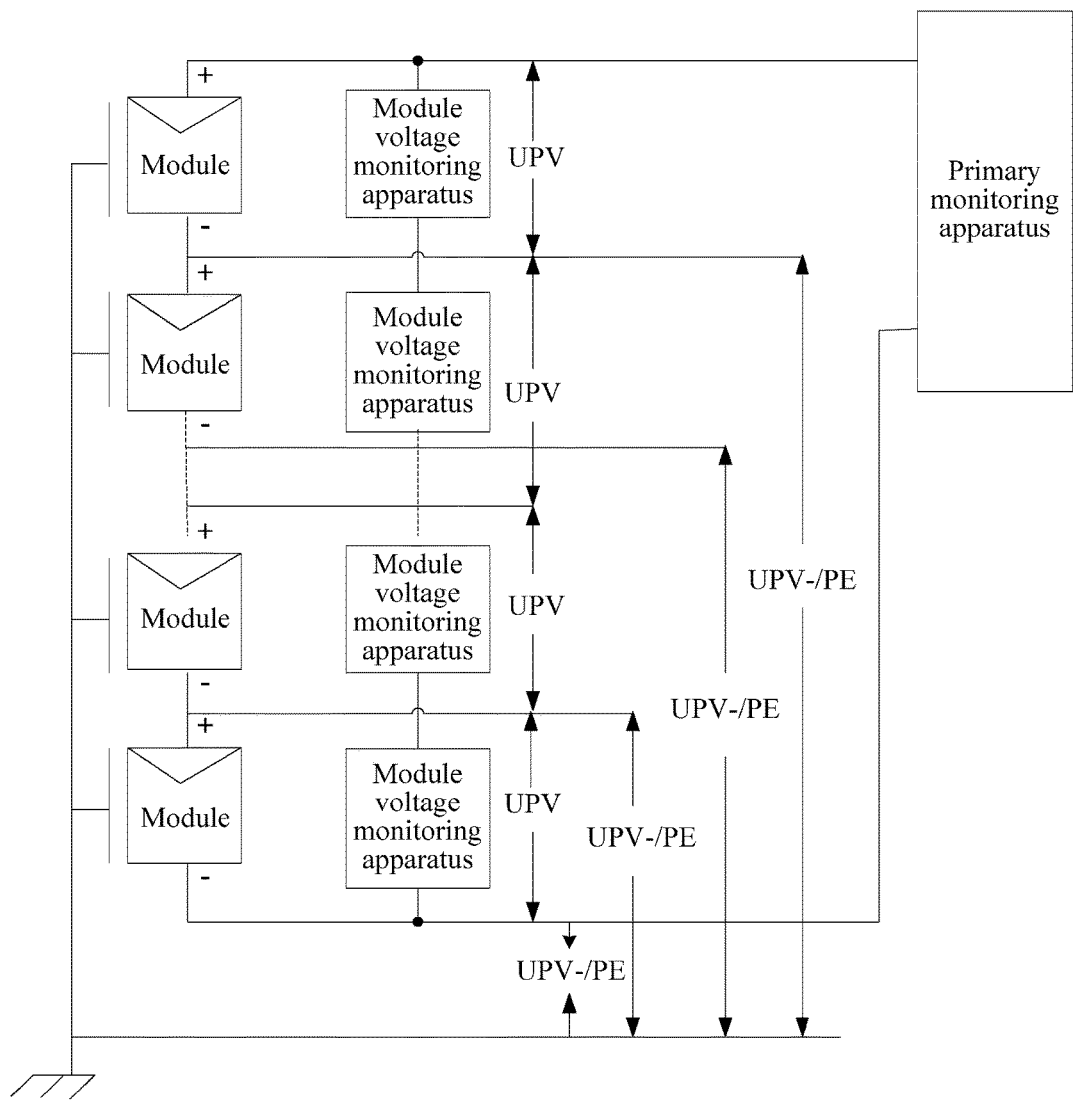
FIG. 1 is a schematic application diagram of a module voltage monitoring system according to some embodiments of the present application.

Embodiments of the present application provide a method for monitoring a photovoltaic module, to reduce a commissioning workload at an early establishment stage of a photovoltaic power generating system and reduce commissioning complexity. The embodiments of the present application correspondingly further provide an apparatus for monitoring a photovoltaic module.

The following clearly describes the technical solutions in the embodiments of the present application with reference to the accompanying drawings in the embodiments of the present application. The described embodiments are merely a part rather than all of the embodiments of the present application. All other embodiments obtained by a person of ordinary skill in the art based on the embodiments of the present application without creative efforts shall fall within the protection scope of the present application.

The present application is applicable to a photovoltaic power generating system. At an early establishment stage of a photovoltaic power generating system, a module voltage monitoring system is established, and the module voltage monitoring system includes a primary monitoring apparatus and several module voltage monitoring apparatuses. The primary monitoring apparatus and the module voltage monitoring apparatus establish a connection in a wireless or wired communications manner. Each photovoltaic string includes several modules connected in series, and each module voltage monitoring apparatus corresponds to one module in the photovoltaic string. It should be noted that, because several photovoltaic strings are disposed in the photovoltaic power generating system, each module voltage monitoring apparatus corresponds to a module in any one of the photovoltaic strings. The module voltage monitoring apparatus can sample an output voltage of a corresponding module and a relative voltage of the corresponding module relative to a voltage reference point, and the like, and send the sampled output voltage or relative voltage to the primary monitoring apparatus, so that the primary monitoring apparatus performs an operation, such as commissioning and setting.

The voltage reference point may be any one of the following voltage reference points: a negative pole of the photovoltaic string, a positive pole of the photovoltaic string, the earth, or a positive pole or a negative pole of any one of modules in the photovoltaic string. A relative voltage of a module relative to a voltage reference point may be a relative voltage of a negative pole of the module relative to the voltage reference point, or may be a relative voltage of a positive pole of the module relative to the voltage reference point. For example, if the earth is used as the voltage reference point of the module in the photovoltaic string, relative voltages of any one of the modules in the photovoltaic string relative to the earth include a voltage of a negative pole of the module to earth and a voltage of a positive pole of the module to earth.

As shown in FIG. 1, FIG. 1 is a schematic application diagram of a module voltage monitoring system according to some embodiments of the present application. In FIG. 1, a module voltage monitoring apparatus is correspondingly disposed for each module in the photovoltaic string, each module voltage monitoring apparatus is connected to a primary monitoring apparatus, and the primary monitoring apparatus allocates a communication address to each module voltage monitoring apparatus. The module voltage monitoring apparatus corresponds one-to-one to the communication address. Therefore, in FIG. 1, the module voltage monitoring apparatus can sample an output voltage of a module and a relative voltage of the module relative to a voltage reference point, and the primary monitoring apparatus establishes a connection to the module voltage monitoring apparatus using a communication address, and obtains an output voltage of a corresponding module and a relative voltage of the corresponding module relative to the voltage reference point from the module voltage monitoring apparatus.

Figure 2:
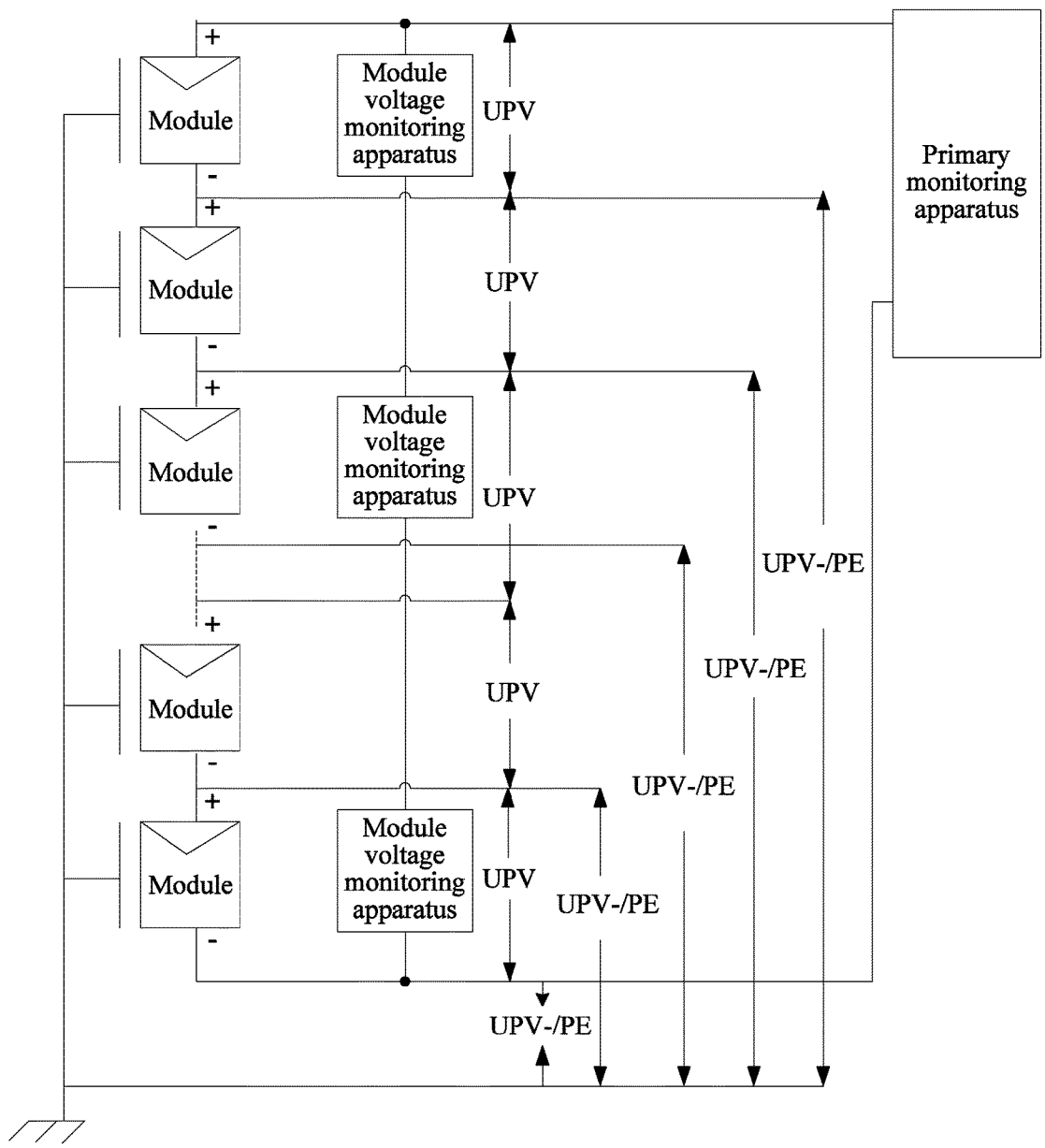
FIG. 2 is a schematic application diagram of a module voltage monitoring system according to other embodiments of the present application.

As shown in FIG. 2, FIG. 2 is a schematic application diagram of a module voltage monitoring system according to other embodiments of the present application. In FIG. 2, module voltage monitoring apparatuses are correspondingly disposed for some modules in the photovoltaic string, and are disposed in the following two manners.

Case 1: When a total quantity of modules of the photovoltaic string is an odd number, a module voltage monitoring apparatus is disposed for a module corresponding to an odd-number physical location.

Case 2: When a total quantity of modules in the photovoltaic string is an even number, module voltage monitoring apparatuses are disposed for the first module of a positive pole of the photovoltaic string and a module corresponding to an even-number physical location.

Based on FIG. 2, the module voltage monitoring apparatus samples an output voltage of a corresponding module and a relative voltage of the corresponding module relative to a voltage reference point, and the primary monitoring apparatus obtains the output voltage of the corresponding module and the relative voltage of the corresponding module relative to the voltage reference point from the module voltage monitoring apparatus. An output voltage of another module for which no module voltage monitoring apparatus is disposed or a relative voltage of the another module relative to the voltage reference point may be calculated using a relative voltage of a neighboring module for which a module voltage monitoring apparatus is disposed relative to the voltage reference point. A specific calculation method is described subsequently in detail, and details are not described herein.

Using the module voltage monitoring system shown in FIG. 2, a quantity of the module voltage monitoring apparatuses may be reduced, so that construction costs of a photovoltaic power generating system can be reduced.

FIG. 1 and FIG. 2 are only schematic application diagrams of some module voltage monitoring systems in the embodiments of the present application. Another schematic application diagram that is obtained by transforming FIG. 1 and FIG. 2 or by another means and that can implement the technical purposes of the present application, and achieve the beneficial effects of the present application shall fall within the protection scope of the present application, and are not limited herein.

Based on the foregoing descriptions, an embodiment of the present application provides a method for monitoring a photovoltaic module, applied to a module voltage monitoring system. The module voltage monitoring system includes a primary monitoring apparatus and several module voltage monitoring apparatuses, a communication address is allocated to each module voltage monitoring apparatus, the primary monitoring apparatus establishes a connection to the corresponding module voltage monitoring apparatus using the communication address, each module voltage monitoring apparatus corresponds to a module of a photovoltaic string, and the module voltage monitoring apparatus is configured to sample a relative voltage of the corresponding module relative to a voltage reference point. The method includes obtaining, by the primary monitoring apparatus, communication addresses of all the module voltage monitoring apparatuses, establishing a connection to a corresponding module voltage monitoring apparatus using the communication address, and obtaining a relative voltage of a corresponding module relative to the voltage reference point from the module voltage monitoring apparatus to which the connection is established; obtaining, by the primary monitoring apparatus according to relative voltages obtained from all the module voltage monitoring apparatuses, a physical location that is of a module corresponding to each module voltage monitoring apparatus and that is in the photovoltaic string; and establishing, by the primary monitoring apparatus, an information table according to the communication address of each module voltage monitoring apparatus and the physical location of the module corresponding to each module voltage monitoring apparatus, and performing module abnormality detection according to the information table, where the information table includes at least a correspondence between the communication address of each module voltage monitoring apparatus and the physical location of the module corresponding to each module voltage monitoring apparatus.

Figure 3:
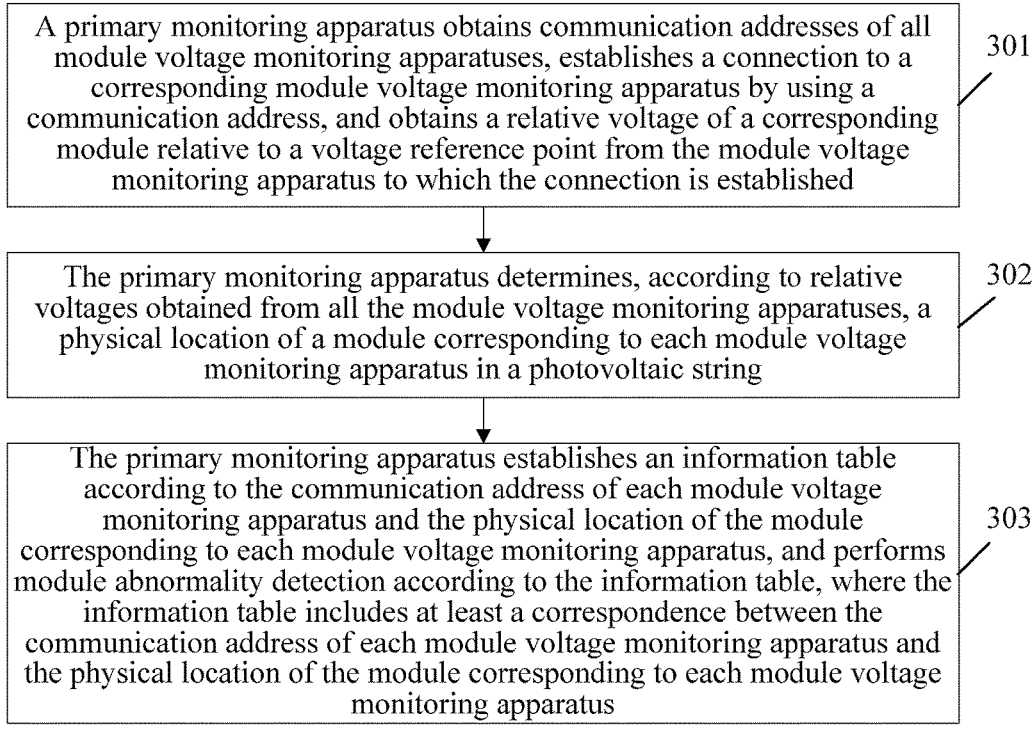
FIG. 3 is a schematic flowchart of a method for monitoring a photovoltaic module according to an embodiment of the present application.

Referring to FIG. 3, FIG. 3 is a schematic flowchart of a method for monitoring a photovoltaic module according to some embodiments of the present application. As shown in FIG. 3, a method for monitoring a photovoltaic module is applied to a module voltage monitoring system, the module voltage monitoring system includes a primary monitoring apparatus and several module voltage monitoring apparatuses, a communication address is allocated to each module voltage monitoring apparatus, the primary monitoring apparatus establishes a connection to the corresponding module voltage monitoring apparatus using the communication address, each module voltage monitoring apparatus corresponds to a module of a photovoltaic string, and the module voltage monitoring apparatus is configured to sample a relative voltage of the corresponding module relative to a voltage reference point. The method may include the following steps.

301: The primary monitoring apparatus obtains communication addresses of all the module voltage monitoring apparatuses, establishes a connection to a corresponding module voltage monitoring apparatus using the communication address, and obtains a relative voltage of a corresponding module relative to the voltage reference point from the module voltage monitoring apparatus to which the connection is established.

With reference to FIG. 1 or FIG. 2, the primary monitoring apparatus automatically searches for a communication address of a module voltage monitoring apparatus, establishes a connection to a corresponding module voltage monitoring apparatus based on a found communication address, directly obtains a relative voltage of the corresponding module relative to a voltage reference point from the module voltage monitoring apparatus to which the connection is established. If some modules correspond to no module voltage monitoring apparatus, the primary monitoring apparatus obtains the relative voltage through calculation according to a relative voltage of another module relative to the voltage reference point, so as to obtain relative voltages of all modules in the photovoltaic string relative to a same voltage reference point.

The voltage reference point in this embodiment of the present application and subsequent embodiments may be any one of the voltage reference points described above. A relative voltage of a module relative to a voltage reference point includes a positive pole relative voltage of a positive pole of the module relative to the voltage reference point or a negative pole relative voltage of a negative pole of the module relative to the voltage reference point.

For example, when the voltage reference point is the earth, a negative pole relative voltage of a negative pole of a module relative to earth is a voltage of the negative pole of the module to earth.

302: The primary monitoring apparatus determines, according to relative voltages obtained from all the module voltage monitoring apparatuses, a physical location that is of a module corresponding to each module voltage monitoring apparatus and that is in the photovoltaic string.

Preferably, in a process of performing step 302, the primary monitoring apparatus determines, according to a sequence of values of the relative voltages obtained from all the module voltage monitoring apparatuses, the physical location that is of the module corresponding to each module voltage monitoring apparatus and that is in the photovoltaic string.

The physical location of the module in the photovoltaic string is determined according to a positive pole relative voltage of a positive pole of the module relative to the voltage reference point, or a negative pole relative voltage of a negative pole of the module relative to the voltage reference point. It should be understood that, because the photovoltaic string includes modules whose positive poles/negative poles are connected in series head-to-tail, assuming that the modules are sorted from a negative pole to a positive pole of the photovoltaic string, relative voltages of positive poles/negative poles of the modules and a same voltage reference point increase linearly based on a property of the photovoltaic string formed by means of series connection. On the contrary, if the modules are sorted from a positive pole to a negative pole of the photovoltaic string, relative voltages of positive poles/negative poles of the modules relative to a same voltage reference point decrease linearly. Therefore, physical locations of the modules may be determined according to the relative voltages of the positive poles/negative poles of the modules. Locations may start to be numbered from a negative pole to a positive pole of the photovoltaic string, or locations may start to be numbered from a positive pole to a negative pole of the photovoltaic string. This is not limited herein.

303: The primary monitoring apparatus establishes an information table according to the communication address of each module voltage monitoring apparatus and the physical location of the module corresponding to each module voltage monitoring apparatus, and performs module abnormality detection according to the information table, where the information table includes at least a correspondence between the communication address of each module voltage monitoring apparatus and the physical location of the module corresponding to each module voltage monitoring apparatus.

It can be seen that, a primary monitoring apparatus in this embodiment of the present application first obtains communication addresses of all module voltage monitoring apparatuses, establishes a connection to a corresponding module voltage monitoring apparatus using the communication address, and therefore may obtain a relative voltage of a corresponding module relative to a voltage reference point from the module voltage monitoring apparatus. The primary monitoring apparatus determines, according to a relative voltage obtained from each module voltage monitoring apparatus, a physical location of a module corresponding to the module voltage monitoring apparatus in a photovoltaic string, finally establishes an information table according to the communication address of each module voltage monitoring apparatus and the physical location of the module corresponding to each module voltage monitoring apparatus, and therefore may perform module abnormality detection according to the information table. The information table stores a correspondence between the communication address of each module voltage monitoring apparatus and the physical location of the module corresponding to each module voltage monitoring apparatus. In the present application, when system commissioning is performed at an early establishment stage of a photovoltaic power generating system, a conventional manner of manually recording information is discarded, and instead, a communication address of a module voltage monitoring apparatus corresponding to a module is automatically obtained, a connection to the module voltage monitoring apparatus is established using the obtained communication address, a relative voltage of the module is automatically collected from the module voltage monitoring apparatus, and according to a variation property of a relative voltage of a module in the photovoltaic string relative to a voltage reference point, a physical location that is of a module corresponding to each module voltage monitoring apparatus and that is in the photovoltaic string is determined using a relative voltage, to reduce a workload at an early commissioning stage and reduce commissioning complexity.

In some embodiments of the present application, referring to FIG. 1, a corresponding module voltage monitoring apparatus is disposed for each module in the photovoltaic string. For example, in the module voltage monitoring system shown in FIG. 1, a module voltage monitoring apparatus is correspondingly disposed for each module in the photovoltaic string, and the module is connected to the earth using a shell. At an early establishment stage of a photovoltaic power generating system, the primary monitoring apparatus automatically searches for a module voltage monitoring apparatus, and obtains a communication address of a module voltage monitoring apparatus corresponding to each module, and the primary monitoring apparatus establishes a connection to a module voltage monitoring apparatus using a found communication address. The module voltage monitoring apparatus samples an output voltage UPV of a corresponding module, a voltage UPV−/PE of a negative pole of the module to earth, and a voltage (not shown in FIG. 1) of a positive pole of the module to earth, and the like. The output voltage UPV is a voltage between the negative pole and the positive pole of the module.

The primary monitoring apparatus obtains the voltage UPV−/PE of the negative pole of the module to earth from the module voltage monitoring apparatus, determines a physical location of the module in the photovoltaic string according to the voltage UPV−/PE of the negative pole to earth, and establishes an information table using the physical location of the module and a communication address of the module voltage monitoring apparatus corresponding to the module. The information table is stored in a memory, and when module abnormality detection is performed subsequently, a physical location of an abnormal module may be accurately located using the information table. As shown in Table 1, the primary monitoring apparatus obtains a voltage 360 of a negative pole to earth from a module voltage monitoring apparatus whose communication address is 100, obtains a voltage 324 of a negative pole to earth from the module voltage monitoring apparatus whose communication address is 101, and so on, until obtains a voltage −324 of a negative pole to earth from a module voltage monitoring apparatus whose communication address is 119. The primary monitoring apparatus sequentially determines, according to a sequence of the values of the voltages of the negative poles to earth, a physical location of a module corresponding to each communication address in a photovoltaic string.

TABLE 1

| Physical location | Communication address | Voltage of a negative pole to earth |
|---|---|---|
| 1 | 100 | 360 |
| 2 | 101 | 324 |
| 3 | 102 | 288 |
| 4 | 103 | 252 |
| 5 | 104 | 216 |
| 6 | 105 | 180 |
| 7 | 106 | 144 |
| 8 | 107 | 108 |
| 9 | 108 | 72 |
| 10 | 117 | 36 |
| 11 | 116 | 0 |
| 12 | 115 | −36 |
| 13 | 114 | −72 |
| 14 | 113 | −108 |
| 15 | 112 | −144 |
| 16 | 111 | −180 |
| 17 | 110 | −216 |
| 18 | 109 | −252 |
| 19 | 118 | −288 |
| 20 | 119 | −324 |

As shown in Table 2, the primary monitoring apparatus may also obtain an output voltage UPV of a module, a voltage UPV−/PE of a negative pole to earth, and a voltage of a positive pole to earth from a module voltage monitoring apparatus, and may determine a physical location of a module in the photovoltaic string according to a voltage of a negative pole of the module to earth or a voltage of a positive pole of the module to earth.

TABLE 2

| Physical location | Communication address | Output voltage | Voltage of a positive pole to earth | Voltage of a negative pole to earth |
|---|---|---|---|---|
| 1 | 100 | 37 | 397 | 360 |
| 2 | 101 | 36 | 360 | 324 |
| 3 | 102 | 34 | 322 | 288 |
| 4 | 103 | 36 | 288 | 252 |
| 5 | 104 | 35 | 251 | 216 |
| 6 | 105 | 36 | 216 | 180 |
| 7 | 106 | 36 | 180 | 144 |
| 8 | 107 | 36 | 144 | 108 |
| 9 | 108 | 37 | 109 | 72 |
| 10 | 117 | 36 | 72 | 36 |
| 11 | 116 | 32 | 32 | 0 |
| 12 | 115 | 36 | 0 | −36 |
| 13 | 114 | 37 | −35 | −72 |
| 14 | 113 | 36 | −72 | −108 |
| 15 | 112 | 36 | −108 | −144 |
| 16 | 111 | 34 | −146 | −180 |
| 17 | 110 | 36 | −180 | −216 |
| 18 | 109 | 39 | −213 | −252 |
| 19 | 118 | 36 | −252 | −288 |
| 20 | 119 | 39 | −285 | −324 |

The physical locations of the modules are determined according to Table 1 or Table 2, and an information table is established using the physical locations of the modules and the communication addresses. The information table is shown in Table 3.

TABLE 3

| Physical location | Communication address |
|---|---|
| 1 | 100 |
| 2 | 101 |
| 3 | 102 |
| 4 | 103 |
| 5 | 104 |
| 6 | 105 |
| 7 | 106 |
| 8 | 107 |
| 9 | 108 |
| 10 | 117 |
| 11 | 116 |
| 12 | 115 |
| 13 | 114 |
| 14 | 113 |
| 15 | 112 |
| 16 | 111 |
| 17 | 110 |
| 18 | 109 |
| 19 | 118 |
| 20 | 119 |

For another example, referring to FIG. 2, it is assumed that a total quantity of modules of a photovoltaic string is an odd number 21 in the module voltage monitoring system shown in FIG. 2. A module voltage monitoring apparatus is disposed for a module corresponding to an odd-number physical location, and the module voltage monitoring apparatus in the odd-number physical location samples an output voltage UPV of the corresponding module, a voltage UPV−/PE of a negative pole of the corresponding module to earth, and a voltage (not shown in FIG. 2) of a positive pole of the corresponding module to earth. The primary monitoring apparatus actively searches for a communication address of a module voltage monitoring apparatus. Certainly, in this embodiment of the present application, the primary monitoring apparatus can find only a communication address of the module voltage monitoring apparatus corresponding to the module that corresponds to the odd-number physical location, and no module voltage monitoring apparatus is disposed for a module corresponding to an even-number physical location. The primary monitoring apparatus establishes a connection to the module voltage monitoring apparatus using the communication address, obtains an output voltage UPV of the module corresponding to the odd-number physical location, a voltage UPV−/PE of a negative pole of the module to earth, and a voltage of a positive pole of the module to earth from the module voltage monitoring apparatus. The primary monitoring apparatus determines a physical location of the module at the odd-number physical location in the photovoltaic string according to the voltage UPV−/PE of the negative pole of the module corresponding to the odd-number physical location to earth or the voltage of the positive pole of the module corresponding to the odd-number physical location to earth, that is, may obtain information of the first column and the second column shown in Table 4 below. The primary monitoring apparatus calculates, according to the voltage UPV−/PE of the negative pole of the module corresponding to the odd-number physical location to earth and the voltage of the positive pole of the module corresponding to the odd-number physical location to earth, a voltage of a negative pole of the module corresponding to the even-number physical location to earth or a voltage of a positive pole of the module corresponding to the even-number physical location to earth, so as to determine physical locations of all the modules in the photovoltaic string.

Table 4 is as shown below.

TABLE 4

| Physical location | Communication address | Output voltage | Voltage of a positive pole to earth | Voltage of a negative pole to earth | Calculated output voltage of a module having no communication address | Calculated voltage of a negative pole of a module having no communication address to earth |
|---|---|---|---|---|---|---|
| 1 | 100 | 37 | 397 | 360 | | |
| 2 | | | | | 38 | 322 |
| 3 | 102 | 34 | 322 | 288 | | |
| 4 | | | | | 37 | 251 |
| 5 | 104 | 35 | 251 | 216 | | |
| 6 | | | | | 36 | 180 |
| 7 | 106 | 36 | 180 | 144 | | |
| 8 | | | | | 35 | 109 |
| 9 | 108 | 37 | 109 | 72 | | |
| 10 | | | | | 40 | 32 |
| 11 | 116 | 32 | 32 | 0 | | |
| 12 | | | | | 35 | −35 |
| 13 | 114 | 37 | −35 | −72 | | |
| 14 | | | | | 36 | −108 |
| 15 | 112 | 36 | −108 | −144 | | |
| 16 | | | | | 36 | −180 |
| 17 | 110 | 36 | −180 | −216 | | |
| 18 | | | | | 36 | −252 |
| 19 | 118 | 36 | −252 | −288 | | |
| 20 | | | | | 34 | −322 |
| 21 | 120 | 38 | −322 | −360 | | |

The physical locations of all the modules in the photovoltaic string are determined according to the voltages UPV−/PE of the negative poles of the modules to earth or the voltages of the positive poles of the modules to earth in Table 4, and an information table shown in Table 5 is established according to the physical locations and the communication addresses.

TABLE 5

| Physical location | Communication address |
|---|---|
| 1 | 100 |
| 2 | |
| 3 | 102 |
| 4 | |
| 5 | 104 |
| 6 | |
| 7 | 106 |
| 8 | |
| 9 | 108 |
| 10 | |
| 11 | 116 |
| 12 | |
| 13 | 114 |
| 14 | |
| 15 | 112 |
| 16 | |
| 17 | 110 |
| 18 | |
| 19 | 118 |
| 20 | |
| 21 | 120 |

Referring to FIG. 2 and Table 4, it can be seen that, a voltage of a negative pole of a module whose physical location is 2 to earth is a voltage of a positive pole of a module whose physical location is 3 to earth. Therefore, a voltage of a negative pole of a module at an even-number physical location to earth may be obtained according to a voltage of a positive pole of a module at an odd-number physical location to earth. An output voltage of the module at the even-number physical location is obtained by subtracting a voltage of a positive pole of a module corresponding to the next odd-number physical location to earth from a voltage of a negative pole of a module corresponding to the last odd-number physical location to earth. For example, an output voltage of a module whose physical location is 2=a voltage of a negative pole of a module whose physical location is 1 to earth−a voltage of a positive pole of a module whose physical location is 3 to earth.

On the contrary, when a total quantity of the modules in the photovoltaic string is an even number, module voltage monitoring apparatuses are disposed for the first module of a positive pole of the photovoltaic string and a module corresponding to an even-number physical location. A module voltage monitoring apparatus samples an output voltage of the first module of the positive pole of the photovoltaic string, a voltage of a negative pole of the first module to earth, and a voltage of a positive pole of the first module to earth, and an output voltage of the module corresponding to the even-number physical location, a voltage of a negative pole of the module corresponding to the even-number physical location to earth, and a voltage of a positive pole of the module corresponding to the even-number physical location to earth. A voltage of a negative pole of a module corresponding to an odd-number physical location to earth and a voltage of a positive pole of the module corresponding to the odd-number physical location to earth are obtained according to voltages of negative poles of modules at two neighboring even-number physical locations to earth and voltages of positive poles of the modules at the two neighboring even-number physical locations to earth. For example, a voltage of a negative pole of the module whose physical location is 3 to earth is a voltage of a positive pole of a module whose physical location is 4 to earth, and an output voltage of the module whose physical location is 3=a voltage of a negative pole of the module whose physical location is 2 to earth−a voltage of a positive pole of the module whose physical location is 4 to earth. Therefore, a voltage of a negative pole of a module of the last odd-number physical location to earth may be obtained according to a voltage of a positive pole of a module at an even-number physical location to earth, and an output voltage of the module at the odd-number physical location is obtained by subtracting a voltage of a positive pole of a module of the next even-number physical location to earth from a voltage of a negative pole of a module of the last even-number physical location to earth.

Based on the foregoing descriptions, the performing module abnormality detection according to the information table in step 303 includes establishing, by the primary monitoring apparatus, a connection to a corresponding module voltage monitoring apparatus using each communication address, and obtaining an output voltage of a corresponding module from the module voltage monitoring apparatus to which the connection is established; determining, by the primary monitoring apparatus according to output voltages obtained from all the module voltage monitoring apparatuses, whether the module corresponding to each module voltage monitoring apparatus is abnormal; and when determining that a module corresponding to any one of the module voltage monitoring apparatus is abnormal, obtaining, by the primary monitoring apparatus according to a communication address of the module voltage monitoring apparatus and the information table, a physical location that is of the module corresponding to the module voltage monitoring apparatus and that is in the photovoltaic string.

In a possible implementation manner of the present application, when a quantity of the modules of the photovoltaic string is an odd number, a module at an odd-number physical location in the photovoltaic string and the module voltage monitoring apparatus correspond one-to-one to each other. The performing module abnormality detection according to the information table in step 303 further includes establishing, by the primary monitoring apparatus, a connection to a corresponding module voltage monitoring apparatus using each communication address, and obtaining an output voltage of a module at an odd-number physical location in the photovoltaic string, a positive pole relative voltage of the module, and a negative pole relative voltage of the module from the module voltage monitoring apparatus to which the connection is established. The positive pole relative voltage is a relative voltage of a positive pole of the module relative to the voltage reference point, and the negative pole relative voltage is a relative voltage of a negative pole of the module relative to the voltage reference point; calculating, by the primary monitoring apparatus, an output voltage of a module at an even-number physical location between modules at two neighboring odd-number physical locations according to positive pole relative voltages and negative pole relative voltages of the modules at the two odd-number physical locations in the information table; determining, by the primary monitoring apparatus according to the output voltage, whether the module at the even-number physical location between the modules at the two odd-number physical locations is abnormal; and when determining that the module at the even-number physical location between the modules at the two odd-number physical locations is abnormal, obtaining, by the primary monitoring apparatus, a physical location of the module at the even-number physical location between the modules at the two odd-number physical locations according to physical locations of the modules at the two odd-number physical locations in the information table.

In another possible implementation manner of the present application, when a quantity of the modules of the photovoltaic string is an even number, the first module of a positive pole of the photovoltaic string and a module at an even-number physical location correspond one-to-one to the module voltage monitoring apparatuses. The performing module abnormality detection according to the information table in the step 303 further includes establishing, by the primary monitoring apparatus, a connection to a corresponding module voltage monitoring apparatus using each communication address, and obtaining output voltages, positive pole relative voltages, and negative pole relative voltages of the first module of the positive pole of the photovoltaic string and the module at the even-number physical location from the module voltage monitoring apparatuses to which the connections are established. The positive pole relative voltage is a relative voltage of a positive pole of the module relative to the voltage reference point, and the negative pole relative voltage is a relative voltage of a negative pole of the module relative to the voltage reference point; calculating, by the primary monitoring apparatus, an output voltage of a module at an odd-number physical location between modules at two neighboring even-number physical locations according to positive pole relative voltages and negative pole relative voltages of the modules at the two even-number physical locations in the information table; determining, by the primary monitoring apparatus according to the output voltage, whether the module at the odd-number physical location between the modules at the two even-number physical locations is abnormal; and when determining that the module at the odd-number physical location between the modules at the two even-number physical locations is abnormal, obtaining, by the primary monitoring apparatus, a physical location of the module at the odd-number physical location between the modules at the two even-number physical locations according to physical locations of the modules at the two even-number physical locations in the information table.

It may be understood that, the most common abnormality of a module is voltage abnormality of the module, and therefore, an output voltage of a module is sampled, and the output voltage is determined. Generally, when a voltage of a module is abnormal, there is a relatively great difference between an output voltage of the module and an output voltage that exists during normal working. Therefore, it may be determined whether the module is abnormal by comparing the sampled output voltage of the module with the output voltage that exists during normal working. Optionally, output voltages of the module that exist during normal working may further be sampled multiple times, an average of the multiple sampled output voltages is obtained, the average may be used as a reference value, the reference value is included in the information table shown in Table 3, and it is determined whether the module is abnormal by comparing a real-time output voltage with the reference value.

Certainly, abnormality of a module may further lead to nonexistence of a communication address, and therefore, based on the application shown in FIG. 1, it may be determined whether a module is abnormal using a communication address.

After it is determined that a module is abnormal, a physical location of the module may be found in the information table according to a communication address, so as to accurately locate the physical location of the module.

Figure 4:
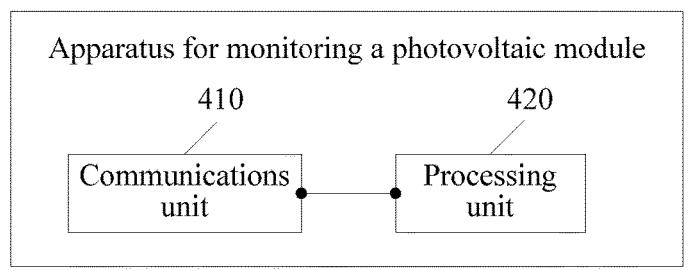
FIG. 4 is a schematic structural diagram of an apparatus for monitoring a photovoltaic module according to an embodiment of the present application.

Referring to FIG. 4, FIG. 4 is a schematic structural diagram of an apparatus for monitoring a photovoltaic module according to an embodiment of the present application. FIG. 4 is applied to a module voltage monitoring system. The module voltage monitoring system includes several module voltage monitoring apparatuses and the apparatus for monitoring a photovoltaic module, a communication address is allocated to each module voltage monitoring apparatus, the apparatus for monitoring a photovoltaic module establishes a connection to the corresponding module voltage monitoring apparatus using the communication address, each module voltage monitoring apparatus corresponds to a module of a photovoltaic string, and the module voltage monitoring apparatus is configured to sample a relative voltage of the corresponding module relative to a voltage reference point. The apparatus for monitoring a photovoltaic module includes a communications module 410 configured to obtain communication addresses of all the module voltage monitoring apparatuses, establish communication with a corresponding module voltage monitoring apparatus using the communication address, and obtain a relative voltage of a corresponding module relative to the voltage reference point from the module voltage monitoring apparatus with which communication is established; and a processing module 420 configured to determine, according to relative voltages obtained from all the module voltage monitoring apparatuses, a physical location that is of a module corresponding to each module voltage monitoring apparatus and that is in the photovoltaic string, establish an information table according to a communication address of each module voltage monitoring apparatus and a physical location of a module corresponding to each module voltage monitoring apparatus, and perform module abnormality detection according to the information table, where the information table includes at least a correspondence between the communication address of each module voltage monitoring apparatus and the physical location of the module corresponding to each module voltage monitoring apparatus.

It can be seen that, the communications module 410 obtains a communication address of a module voltage monitoring apparatus, establishes a connection to the corresponding module voltage monitoring apparatus based on the communication address, and obtains a relative voltage of a module of the photovoltaic string relative to the voltage reference point from the module voltage monitoring apparatus. Because the photovoltaic string includes modules connected in series, the processing module 420 may determine a physical location of the module in the photovoltaic string according to a variation property of the relative voltage of the module in the photovoltaic string relative to the voltage reference point, and establishes an information table using a physical location of each module and a communication address of the module voltage monitoring apparatus corresponding to the module, so that when module abnormality detection is performed, a physical location of the module may be accurately located based on the information table. In the present application, module information is automatically collected and an information table having a physical location of a module and a communication address is established. Compared with the prior art in which a correspondence between a physical location and a communication address is manually recorded, the present application can reduce a workload at an early commissioning stage of a photovoltaic power generating system and commissioning complexity.

Further, the module voltage monitoring apparatus is further configured to sample an output voltage of a corresponding module; the communications module 410 is further configured to establish a connection to a corresponding module voltage monitoring apparatus using each communication address, and obtain an output voltage of a corresponding module from the module voltage monitoring apparatus to which the connection is established; and the processing module 420 is further configured to determine, according to output voltages obtained from all the module voltage monitoring apparatuses, whether the module corresponding to each module voltage monitoring apparatus is abnormal, and when determining that a module corresponding to any one of the module voltage monitoring apparatuses is abnormal, determine, according to a communication address of the module voltage monitoring apparatus and the information table, a physical location that is of the module corresponding to the module voltage monitoring apparatus and that is in the photovoltaic string.

A module in a photovoltaic string and a module voltage monitoring apparatus may include the following correspondence: the module voltage monitoring apparatus and the module in the photovoltaic string correspond one-to-one to each other; or when a quantity of modules in the photovoltaic string is an odd number, a module at an odd-number physical location in the photovoltaic string and the module voltage monitoring apparatus correspond one-to-one to each other; or when a quantity of modules in the photovoltaic string is an even number, the first module of a positive pole of the photovoltaic string and a module at an even-number physical location correspond one-to-one to the module voltage monitoring apparatuses.

In some possible implementation manners of the present application, when the quantity of the modules in the photovoltaic string is the odd number, the module at the odd-number physical location in the photovoltaic string and the module voltage monitoring apparatus correspond one-to-one to each other. The communications module 410 is configured to establish a connection to a corresponding module voltage monitoring apparatus using each communication address, and obtain an output voltage, a positive pole relative voltage, and a negative pole relative voltage of the module at the odd-number physical location in the photovoltaic string from the module voltage monitoring apparatus to which the connection is established, where the positive pole relative voltage is a relative voltage of a positive pole of the module relative to the voltage reference point, and the negative pole relative voltage is a relative voltage of a negative pole of the module relative to the voltage reference point; and the processing module 420 is configured to calculate an output voltage of a module at an even-number physical location between modules at two neighboring odd-number physical locations according to positive pole relative voltages and negative pole relative voltages of the modules at the two odd-number physical locations in the information table; determine, according to the output voltage, whether the module at the even-number physical location between the modules at the two odd-number physical locations is abnormal; and when determining that the module at the even-number physical location between the modules at the two odd-number physical locations is abnormal, determine a physical location of the module at the even-number physical location between the modules at the two odd-number physical locations according to physical locations of the modules at the two odd-number physical locations in the information table.

In other possible implementation manners of the present application, when the quantity of the modules in the photovoltaic string is the even number, the first module of the positive pole of the photovoltaic string and the module at the even-number physical location correspond one-to-one to the module voltage monitoring apparatuses. Therefore, the communications module 410 is configured to establish a connection to a corresponding module voltage monitoring apparatus using each communication address, and obtain output voltages, positive pole relative voltages, and negative pole relative voltages of the first module of the positive pole of the photovoltaic string and the module at the even-number physical location from the module voltage monitoring apparatuses to which the connections are established, where the positive pole relative voltage is a relative voltage of a positive pole of the module relative to the voltage reference point, and the negative pole relative voltage is a relative voltage of a negative pole of the module relative to the voltage reference point; and the processing module 420 is configured to calculate an output voltage of a module at an odd-number physical location between modules at two neighboring even-number physical locations according to positive pole relative voltages and negative pole relative voltages of the modules at the two even-number physical locations in the information table; determine, according to the output voltage, whether the module at the odd-number physical location between the modules at the two even-number physical locations is abnormal; and when determining that the module at the odd-number physical location between the modules at the two even-number physical locations is abnormal, determine a physical location of the module at the odd-number physical location between the modules at the two even-number physical locations according to physical locations of the modules at the two even-number physical locations in the information table.

In other possible implementation manners of the present application, the processing module 420 is configured to determine, according to a sequence of values of relative voltages obtained from all the module voltage monitoring apparatuses, a physical location that is of a module corresponding to each module voltage monitoring apparatus and that is in the photovoltaic string.

It may be understood that, the voltage reference point is any one of the following: the positive pole of the photovoltaic string, a negative pole of the photovoltaic string, the earth, or a positive pole or a negative pole of any one of modules in the photovoltaic string.

It should be noted that, the apparatus for monitoring a photovoltaic module provided in FIG. 4 is the primary monitoring apparatus described in the method embodiments above, and for details, refer to detailed descriptions of the primary monitoring apparatus in the method embodiments.

Figure 5:
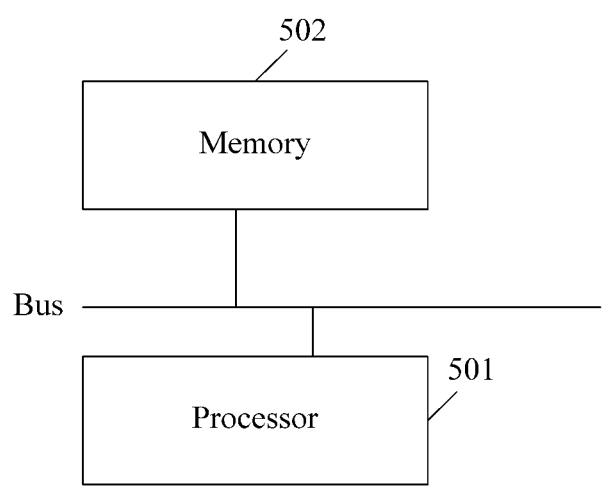
FIG. 5 is a schematic structural diagram of an apparatus for monitoring a photovoltaic module according to another embodiment of the present application.

Referring to FIG. 5, FIG. 5 is a schematic structural diagram of an apparatus for monitoring photovoltaic modules according to another embodiment of the present application. The apparatus may include at least one processor 501 (for example, a central processing unit (CPU)), at least one network interface or another communications interface, a memory 502, and at least one communications bus configured to implement connection and communication between these apparatuses. The processor 501 is configured to execute an executable module that is stored in the memory, for example, a computer program. The memory 502 may include a high-speed random access memory (RAM, or may further include a non-volatile memory, for example, at least one magnetic disk storage. A communication connection between the system gateway and at least one other network element is implemented using the at least one network interface (which may be wired or wireless), and the Internet, a wide area network, a local network, a metropolitan area network, and the like may be used.

As shown in FIG. 5, in some implementation manners, the memory 502 stores a program instruction, the program instruction may be executed by the processor 501, and the processor 501 executes the following steps: obtaining communication addresses of all the module voltage monitoring apparatuses, establishing a connection to a corresponding module voltage monitoring apparatus using the communication address, obtaining a relative voltage of a corresponding module relative to the voltage reference point from the module voltage monitoring apparatus to which the connection is established; determining, according to relative voltages obtained from all the module voltage monitoring apparatuses, a physical location that is of a module corresponding to each module voltage monitoring apparatus and that is in the photovoltaic string; establishing an information table according to the communication address of each module voltage monitoring apparatus and the physical location of the module corresponding to each module voltage monitoring apparatus, and performing module abnormality detection according to the information table. The information table includes at least a correspondence between the communication address of each module voltage monitoring apparatus and the physical location of the module corresponding to each module voltage monitoring apparatus.

In some implementation manners, the processor 501 may further execute the following steps: obtaining a positive pole relative voltage of a positive pole of a module of the photovoltaic string relative to the voltage reference point using the communication address, or obtaining a negative pole relative voltage of a negative pole of a module of the photovoltaic string relative to the voltage reference point using the communication address.

In some implementation manners, the processor 501 may further execute the following steps: establishing a connection to a corresponding module voltage monitoring apparatus using each communication address, and obtaining an output voltage of a corresponding module from the module voltage monitoring apparatus to which the connection is established; determining, according to output voltages obtained from all the module voltage monitoring apparatuses, whether the module corresponding to each module voltage monitoring apparatus is abnormal; and when determining that a module corresponding to any one of the module voltage monitoring apparatuses is abnormal, obtaining, according to a communication address of the module voltage monitoring apparatus and the information table, a physical location that is of the module corresponding to the module voltage monitoring apparatus and that is in the photovoltaic string.

In some implementation manners, when a quantity of modules in the photovoltaic string is an odd number, a module at an odd-number physical location in the photovoltaic string and the module voltage monitoring apparatus correspond one-to-one to each other, and the processor 501 may further execute the following steps: establishing a connection to a corresponding module voltage monitoring apparatus using each communication address, and obtaining an output voltage, a positive pole relative voltage, and a negative pole relative voltage of the module at the odd-number physical location in the photovoltaic string from the module voltage monitoring apparatus to which the connection is established, where the positive pole relative voltage is a relative voltage of a positive pole of the module relative to the voltage reference point, and the negative pole relative voltage is a relative voltage of a negative pole of the module relative to the voltage reference point; calculating an output voltage of a module at an even-number physical location between modules at two neighboring odd-number physical locations according to positive pole relative voltages and negative pole relative voltages of the modules at the two odd-number physical locations in the information table;

determining, according to the output voltage, whether the module at the even-number physical location between the modules at the two odd-number physical locations is abnormal; and when determining that the module at the even-number physical location between the modules at the two odd-number physical locations is abnormal, obtaining a physical location of the module at the even-number physical location between the modules at the two odd-number physical locations according to physical locations of the modules at the two odd-number physical locations in the information table.

In some implementation manners, when a quantity of modules in the photovoltaic string is an even number, the first module of a positive pole of the photovoltaic string and a module at an even-number physical location correspond one-to-one to the module voltage monitoring apparatuses, and the processor 501 may further execute the following steps: establishing a connection to a corresponding module voltage monitoring apparatus using each communication address, and obtaining output voltages, positive pole relative voltages, and negative pole relative voltages of the first module of the positive pole of the photovoltaic string and the module at the even-number physical location from the module voltage monitoring apparatuses to which the connections are established, where the positive pole relative voltage is a relative voltage of a positive pole of the module relative to the voltage reference point, and the negative pole relative voltage is a relative voltage of a negative pole of the module relative to the voltage reference point; calculating an output voltage of a module at an odd-number physical location between modules at two neighboring even-number physical locations according to positive pole relative voltages and negative pole relative voltages of the modules at the two even-number physical locations in the information table; determining, according to the output voltage, whether the module at the odd-number physical location between the modules at the two even-number physical locations is abnormal; and when determining that the module at the odd-number physical location between the modules at the two even-number physical locations is abnormal, obtaining a physical location of the module at the odd-number physical location between the modules at the two even-number physical locations according to physical locations of the modules at the two even-number physical locations in the information table.

In some implementation manners, the processor 501 may further execute the following steps: determining, according to a sequence of values of the relative voltages obtained from all the module voltage monitoring apparatuses, a physical location that is of a module corresponding to each module voltage monitoring apparatus and that is in the photovoltaic string.

In some implementation manners, the memory 502 is configured to store a communication address of a module voltage monitoring apparatus and an information table.

In the foregoing embodiments, the description of each embodiment has respective focuses. For a part that is not described in detail in an embodiment, reference may be made to related descriptions in other embodiments.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one locate, or may be distributed on a plurality of network units. Some or all of the units may be selected according to actual needs to achieve the objectives of the solutions of the embodiments.

In addition, functional units in the embodiments of the present application may be integrated into one processing module, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present application essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of the present application. The foregoing storage medium includes any medium that can store program code, such as a universal serial bus (USB) flash drive, a removable hard disk, a read-only memory (ROM), a RAM), a magnetic disk, or an optical disc.

The method and apparatus for monitoring a photovoltaic module provided by the present application are described above in detail. A person of ordinary skill in the art may make modifications to the specific implementation manners and application scopes according to the ideas of the embodiments of the present application. In conclusion, the specification should not be construed as a limitation to the present application.

What is claimed is:

1. A method for monitoring a photovoltaic module, the method being applied to a module voltage monitoring system, the module voltage monitoring system comprising a primary monitoring apparatus and several module voltage monitoring apparatuses, a communication address being allocated to each module voltage monitoring apparatus, the primary monitoring apparatus establishing a connection to the corresponding module voltage monitoring apparatus using the communication address, each module voltage monitoring apparatus corresponding to a module of a photovoltaic string, the module voltage monitoring apparatus being configured to sample a relative voltage of the corresponding module relative to a voltage reference point, and the method comprising:
   obtaining, by the primary monitoring apparatus, communication addresses of all the module voltage monitoring apparatuses;

establishing a connection to a corresponding module voltage monitoring apparatus using the communication address;

obtaining a relative voltage of a corresponding module relative to the voltage reference point from the module voltage monitoring apparatus to which the connection is established;

obtaining, by the primary monitoring apparatus according to relative voltages obtained from all the module voltage monitoring apparatuses, a physical location that is of a module corresponding to each module voltage monitoring apparatus and that is in the photovoltaic string;

establishing, by the primary monitoring apparatus, an information table according to the communication address of each module voltage monitoring apparatus and the physical location of the module corresponding to each module voltage monitoring apparatus; and performing module abnormality detection according to the information table, the information table comprising at least a correspondence between the communication address of each module voltage monitoring apparatus and the physical location of the module corresponding to each module voltage monitoring apparatus, the module voltage monitoring apparatus and the module in the photovoltaic string corresponding one-to-one to each other, a module at an odd-number physical location in the photovoltaic string and the module voltage monitoring apparatus corresponding one-to-one to each other when a quantity of modules in the photovoltaic string is an odd number, or the first module of a positive pole of the photovoltaic string and a module at an even-number physical location corresponding one-to-one to the module voltage monitoring apparatuses when a quantity of modules in the photovoltaic string is an even number.

2. The method of claim 1, wherein the module voltage monitoring apparatus is further configured to sample an output voltage of the corresponding module, and performing the module abnormality detection according to the information table comprises:

establishing, by the primary monitoring apparatus, a connection to a corresponding module voltage monitoring apparatus using each communication address;

obtaining an output voltage of a corresponding module from the module voltage monitoring apparatus to which the connection is established;

determining, by the primary monitoring apparatus according to output voltages obtained from all the module voltage monitoring apparatuses, whether the module corresponding to each module voltage monitoring apparatus is abnormal; and determining, by the primary monitoring apparatus according to a communication address of the module voltage monitoring apparatus and the information table, a physical location that is of the module corresponding to the module voltage monitoring apparatus and that is in the photovoltaic string when a module corresponding to any one of the module voltage monitoring apparatuses is abnormal.

3. The method of claim 1, wherein when the quantity of the modules in the photovoltaic string is the odd number, the module at the odd-number physical location in the photovoltaic string and the module voltage monitoring apparatus correspond one-to-one to each other, and performing the module abnormality detection according to the information table further comprises:

establishing, by the primary monitoring apparatus, a connection to a corresponding module voltage monitoring apparatus using each communication address;

obtaining an output voltage, a positive pole relative voltage, and a negative pole relative voltage of the module at the odd-number physical location in the photovoltaic string from the module voltage monitoring apparatus to which the connection is established, the positive pole relative voltage being a relative voltage of a positive pole of the module relative to the voltage reference point, and the negative pole relative voltage being a relative voltage of a negative pole of the module relative to the voltage reference point;

calculating, by the primary monitoring apparatus, an output voltage of a module at an even-number physical location between modules at two neighboring odd-number physical locations according to positive pole relative voltages and negative pole relative voltages of the modules at the two odd-number physical locations in the information table;

determining, by the primary monitoring apparatus according to the output voltage, whether the module at the even-number physical location between the modules at the two odd-number physical locations is abnormal; and obtaining, by the primary monitoring apparatus, a physical location of the module at the even-number physical location between the modules at the two odd-number physical locations according to physical locations of the modules at the two odd-number physical locations in the information table when the module at the even-number physical location between the modules at the two odd-number physical locations is abnormal.

4. The method of claim 1, wherein when the quantity of the modules in the photovoltaic string is the even number, the first module of the positive pole of the photovoltaic string and the module at the even-number physical location correspond one-to-one to the module voltage monitoring apparatuses, and performing the module abnormality detection according to the information table further comprises:

establishing, by the primary monitoring apparatus, a connection to a corresponding module voltage monitoring apparatus using each communication address;

obtaining output voltages, positive pole relative voltages, and negative pole relative voltages of the first module of the positive pole of the photovoltaic string and the module at the even-number physical location from the module voltage monitoring apparatuses to which the connections are established, the positive pole relative voltage being a relative voltage of a positive pole of the module relative to the voltage reference point, and the negative pole relative voltage being a relative voltage of a negative pole of the module relative to the voltage reference point;

calculating, by the primary monitoring apparatus, an output voltage of a module at an odd-number physical location between modules at two neighboring even-number physical locations according to positive pole relative voltages and negative pole relative voltages of the modules at the two even-number physical locations in the information table;

determining, by the primary monitoring apparatus according to the output voltage, whether the module at the odd-number physical location between the modules at the two even-number physical locations is abnormal; and obtaining, by the primary monitoring apparatus, a physical location of the module at the odd-number physical location between the modules at the two even-number physical locations according to physical locations of the modules at the two even-number physical locations in the information table when the module at the odd-number physical location between the modules at the two even-number physical locations is abnormal.

5. The method of claim 1, wherein obtaining, by the primary monitoring apparatus according to the relative voltages obtained from all the module voltage monitoring apparatuses, the physical location that is of the module corresponding to each module voltage monitoring apparatus and that is in the photovoltaic string comprises obtaining, by the primary monitoring apparatus according to a sequence of values of the relative voltages obtained from all the module voltage monitoring apparatuses, the physical location that is of the module corresponding to each module voltage monitoring apparatus and that is in the photovoltaic string.

6. The method of claim 5, wherein the voltage reference point is any one of the following: the positive pole of the photovoltaic string, a negative pole of the photovoltaic string, the earth, or a positive pole or a negative pole of any one of modules in the photovoltaic string.

7. An apparatus for monitoring a photovoltaic module, the apparatus being applied to a module voltage monitoring system, the module voltage monitoring system comprising several module voltage monitoring apparatuses and the apparatus for monitoring a photovoltaic module, a communication address being allocated to each module voltage monitoring apparatus, the apparatus for monitoring a photovoltaic module establishing a connection to the corresponding module voltage monitoring apparatus using the communication address, each module voltage monitoring apparatus corresponding to a module of a photovoltaic string, the module voltage monitoring apparatus being configured to sample a relative voltage of the corresponding module relative to a voltage reference point, and the apparatus for monitoring a photovoltaic module comprising:

a communications module configured to:
  obtain communication addresses of all the module voltage monitoring apparatuses;
  establish communication with a corresponding module voltage monitoring apparatus using the communication address; and
  obtain a relative voltage of a corresponding module relative to the voltage reference point from the module voltage monitoring apparatus with which communication is established; and a processing module configured to:
  determine, according to relative voltages obtained from all the module voltage monitoring apparatuses, a physical location that is of a module corresponding to each module voltage monitoring apparatus and that is in the photovoltaic string;
  establish an information table according to the communication address of each module voltage monitoring apparatus and the physical location of the module corresponding to each module voltage monitoring apparatus; and
  perform module abnormality detection according to the information table, the information table comprising at least a correspondence between the communication address of each module voltage monitoring apparatus and the physical location of the module corresponding to each module voltage monitoring apparatus, the module voltage monitoring apparatus and the module in the photovoltaic string corresponding one-to-one to each other, a module at an odd-number physical location in the photovoltaic string and the module voltage monitoring apparatus corresponding one-to-one to each other when a quantity of modules in the photovoltaic string is an odd number, or the first module of a positive pole of the photovoltaic string and a module at an even-number physical location corresponding one-to-one to the module voltage monitoring apparatuses when a quantity of modules in the photovoltaic string is an even number.

8. The apparatus for monitoring the photovoltaic module of claim 7, wherein the module voltage monitoring apparatus is further configured to sample an output voltage of the corresponding module, the communications module being further configured to establish a connection to a corresponding module voltage monitoring apparatus using each communication address, and obtain an output voltage of a corresponding module from the module voltage monitoring apparatus to which the connection is established, and the processing module being further configured to determine, according to output voltages obtained from all the module voltage monitoring apparatuses, whether the module corresponding to each module voltage monitoring apparatus is abnormal, and when determining that a module corresponding to any one of the module voltage monitoring apparatuses is abnormal, determine, according to a communication address of the module voltage monitoring apparatus and the information table, a physical location that is of the module corresponding to the module voltage monitoring apparatus and that is in the photovoltaic string.

9. The apparatus for monitoring the photovoltaic module of claim 7, wherein when the quantity of the modules in the photovoltaic string is the odd number, the module at the odd-number physical location in the photovoltaic string and the module voltage monitoring apparatus correspond one-to-one to each other, the communications module being configured to establish a connection to a corresponding module voltage monitoring apparatus using each communication address, and obtain an output voltage, a positive pole relative voltage, and a negative pole relative voltage of the module at the odd-number physical location in the photovoltaic string from the module voltage monitoring apparatus to which the connection is established, the positive pole relative voltage being a relative voltage of a positive pole of the module relative to the voltage reference point, and the negative pole relative voltage being a relative voltage of a negative pole of the module relative to the voltage reference point, and the processing module being configured to calculate an output voltage of a module at an even-number physical location between modules at two neighboring odd-number physical locations according to positive pole relative voltages and negative pole relative voltages of the modules at the two odd-number physical locations in the information table; determine, according to the output voltage, whether the module at the even-number physical location between the modules at the two odd-number physical locations is abnormal; and when the module at the even-number physical location between the modules at the two odd-number physical locations is abnormal, determine a physical location of the module at the even-number physical location between the modules at the two odd-number physical locations according to physical locations of the modules at the two odd-number physical locations in the information table.

10. The apparatus for monitoring the photovoltaic module of claim 7, wherein when the quantity of the modules in the photovoltaic string is the even number, the first module of the positive pole of the photovoltaic string and the module at the even-number physical location correspond one-to-one to the module voltage monitoring apparatuses, the communications module being configured to establish a connection to a corresponding module voltage monitoring apparatus using each communication address, and obtain output voltages, positive pole relative voltages, and negative pole relative voltages of the first module of the positive pole of the photovoltaic string and the module at the even-number physical location from the module voltage monitoring apparatuses to which the connections are established, the positive pole relative voltage being a relative voltage of a positive pole of the module relative to the voltage reference point, and the negative pole relative voltage being a relative voltage of a negative pole of the module relative to the voltage reference point, and the processing module being configured to calculate an output voltage of a module at an odd-number physical location between modules at two neighboring even-number physical locations according to positive pole relative voltages and negative pole relative voltages of the modules at the two even-number physical locations in the information table; determine, according to the output voltage, whether the module at the odd-number physical location between the modules at the two even-number physical locations is abnormal; and when the module at the odd-number physical location between the modules at the two even-number physical locations is abnormal, determine a physical location of the module at the odd-number physical location between the modules at the two even-number physical locations according to physical locations of the modules at the two even-number physical locations in the information table.

11. The apparatus for monitoring the photovoltaic module of claim 7, wherein the processing module is configured to determine, according to a sequence of values of the relative voltages obtained from all the module voltage monitoring apparatuses, a physical location that is of a module corresponding to each module voltage monitoring apparatus and that is in the photovoltaic string.

12. The apparatus for monitoring the photovoltaic module of claim 11, wherein the voltage reference point is any one of the following: the positive pole of the photovoltaic string, a negative pole of the photovoltaic string, the earth, or a positive pole or a negative pole of any one of modules in the photovoltaic string.

13. A method for monitoring a photovoltaic module, the method being applied to a module voltage monitoring system comprising a primary monitoring apparatus and several module voltage monitoring apparatuses, a communication address being allocated to each module voltage monitoring apparatus, the primary monitoring apparatus establishing a connection to the corresponding module voltage monitoring apparatus using the communication address, each module voltage monitoring apparatus corresponding to a module of a photovoltaic string, the module voltage monitoring apparatus being configured to sample a relative voltage of the corresponding module relative to a voltage reference point, and the method comprising:
obtaining, by the primary monitoring apparatus, communication addresses of all the module voltage monitoring apparatuses;
establishing a connection to a corresponding module voltage monitoring apparatus using the communication address;
obtaining a relative voltage of a corresponding module relative to the voltage reference point from the module voltage monitoring apparatus to which the connection is established;
obtaining, by the primary monitoring apparatus according to relative voltages obtained from all the module voltage monitoring apparatuses, a physical location of a module in the photovoltaic string corresponding to each module voltage monitoring apparatus;
establishing, by the primary monitoring apparatus, an information table according to the communication address of each module voltage monitoring apparatus and the physical location of the module corresponding to each module voltage monitoring apparatus; and
performing module abnormality detection according to the information table, the information table comprising at least a correspondence between the communication address of each module voltage monitoring apparatus and the physical location of the module corresponding to each module voltage monitoring apparatus, the module voltage monitoring apparatus being further configured to sample an output voltage of the corresponding module, and performing the module abnormality detection according to the information table by:
establishing, by the primary monitoring apparatus, a connection to a corresponding module voltage monitoring apparatus using each communication address;
obtaining an output voltage of a corresponding module from the module voltage monitoring apparatus to which the connection is established;
determining, by the primary monitoring apparatus according to output voltages obtained from all the module voltage monitoring apparatuses, whether the module corresponding to each module voltage monitoring apparatus is abnormal; and
determining, by the primary monitoring apparatus according to a communication address of the module voltage monitoring apparatus and the information table, a physical location that is of the module corresponding to the module voltage monitoring apparatus and that is in the photovoltaic string when a module corresponding to any one of the module voltage monitoring apparatuses is abnormal, the module voltage monitoring apparatus and the module in the photovoltaic string corresponding one-to-one to each other, a module at an odd-number physical location in the photovoltaic string and the module voltage monitoring apparatus corresponding one-to-one to each other when a quantity of modules in the photovoltaic string is an odd number, or the first module of a positive pole of the photovoltaic string and a module at an even-number physical location corresponding one-to-one to the module voltage monitoring apparatuses when a quantity of modules in the photovoltaic string is an even number.

14. The method of claim 13, wherein when the quantity of the modules in the photovoltaic string is the odd number, the module at the odd-number physical location in the photovoltaic string and the module voltage monitoring apparatus correspond one-to-one to each other, and performing the module abnormality detection according to the information table further comprises:
establishing, by the primary monitoring apparatus, a connection to a corresponding module voltage monitoring apparatus using each communication address;

obtaining an output voltage, a positive pole relative voltage, and a negative pole relative voltage of the module at the odd-number physical location in the photovoltaic string from the module voltage monitoring apparatus to which the connection is established, the positive pole relative voltage being a relative voltage of a positive pole of the module relative to the voltage reference point, and the negative pole relative voltage being a relative voltage of a negative pole of the module relative to the voltage reference point;

calculating, by the primary monitoring apparatus, an output voltage of a module at an even-number physical location between modules at two neighboring odd-number physical locations according to positive pole relative voltages and negative pole relative voltages of the modules at the two odd-number physical locations in the information table;

determining, by the primary monitoring apparatus according to the output voltage, whether the module at the even-number physical location between the modules at the two odd-number physical locations is abnormal; and obtaining, by the primary monitoring apparatus, a physical location of the module at the even-number physical location between the modules at the two odd-number physical locations according to physical locations of the modules at the two odd-number physical locations in the information table when the module at the even-number physical location between the modules at the two odd-number physical locations is abnormal.

15. The method of claim 13, wherein when the quantity of the modules in the photovoltaic string is the even number, the first module of the positive pole of the photovoltaic string and the module at the even-number physical location correspond one-to-one to the module voltage monitoring apparatuses, and performing the module abnormality detection according to the information table further comprises:

establishing, by the primary monitoring apparatus, a connection to a corresponding module voltage monitoring apparatus using each communication address;

obtaining output voltages, positive pole relative voltages, and negative pole relative voltages of the first module of the positive pole of the photovoltaic string and the module at the even-number physical location from the module voltage monitoring apparatuses to which the connections are established, the positive pole relative voltage being a relative voltage of a positive pole of the module relative to the voltage reference point, and the negative pole relative voltage being a relative voltage of a negative pole of the module relative to the voltage reference point;

calculating, by the primary monitoring apparatus, an output voltage of a module at an odd-number physical location between modules at two neighboring even-number physical locations according to positive pole relative voltages and negative pole relative voltages of the modules at the two even-number physical locations in the information table;

determining, by the primary monitoring apparatus according to the output voltage, whether the module at the odd-number physical location between the modules at the two even-number physical locations is abnormal; and obtaining, by the primary monitoring apparatus, a physical location of the module at the odd-number physical location between the modules at the two even-number physical locations according to physical locations of the modules at the two even-number physical locations in the information table when the module at the odd-number physical location between the modules at the two even-number physical locations is abnormal.

16. The method of claim 15, wherein obtaining, by the primary monitoring apparatus according to the relative voltages obtained from all the module voltage monitoring apparatuses, the physical location that is of the module corresponding to each module voltage monitoring apparatus and that is in the photovoltaic string comprises obtaining, by the primary monitoring apparatus according to a sequence of values of the relative voltages obtained from all the module voltage monitoring apparatuses, the physical location that is of the module corresponding to each module voltage monitoring apparatus and that is in the photovoltaic string.

* * * * *

UNITED STATES PATENT AND TRADEMARK OFFICE
CERTIFICATE OF CORRECTION

PATENT NO. : 10,171,028 B2  
APPLICATION NO. : 15/484702  
DATED : January 1, 2019  
INVENTOR(S) : Yunyan Xu and Yongbing Gao Page 1 of 1

It is certified that error appears in the above-identified patent and that said Letters Patent is hereby corrected as shown below:

On the Title Page

Item (30), Line 1: "201510298854" should read "201510298854.7"

Item (56), OTHER PUBLICATIONS, Line 1: "Form" should read "From"

Signed and Sealed this
Twenty-sixth Day of February, 2019

Andrei Iancu
*Director of the United States Patent and Trademark Office*